(12) United States Patent
Aruga

(10) Patent No.: US 11,289,882 B2
(45) Date of Patent: Mar. 29, 2022

(54) LIGHT SOURCE MODULE

(71) Applicant: NICHIA CORPORATION, Anan (JP)

(72) Inventor: Takanori Aruga, Suwa-gun (JP)

(73) Assignee: NICHIA CORPORATION, Anan (JP)

( * ) Notice: Subject to any disclaimer, the term of this patent is extended or adjusted under 35 U.S.C. 154(b) by 397 days.

(21) Appl. No.: 16/396,269

(22) Filed: Apr. 26, 2019

(65) Prior Publication Data

US 2019/0334321 A1 Oct. 31, 2019

(30) Foreign Application Priority Data

Apr. 27, 2018 (JP) .............................. JP2018-086460

(51) Int. Cl.
*H01S 5/40* (2006.01)
*H04N 9/31* (2006.01)
(Continued)

(52) U.S. Cl.
CPC .......... *H01S 5/4093* (2013.01); *G03B 21/208* (2013.01); *H01S 5/005* (2013.01);
(Continued)

(58) Field of Classification Search
None
See application file for complete search history.

(56) References Cited

U.S. PATENT DOCUMENTS

| 5,777,804 | A | 7/1998 | Nakamura et al. | |
|---|---|---|---|---|
| 2002/0024740 | A1* | 2/2002 | Hashimoto | ........ G02B 19/0057 359/619 |

(Continued)

FOREIGN PATENT DOCUMENTS

| CN | 102052604 A | 5/2011 |
|---|---|---|
| JP | 8-227103 A | 9/1996 |

(Continued)

*Primary Examiner* — Michelle M Iacoletti
*Assistant Examiner* — Danell L Owens
(74) *Attorney, Agent, or Firm* — Birch, Stewart, Kolasch & Birch, LLP

(57) ABSTRACT

A light source module includes a light source and a first optical element. The light source is configured to emit first and second light beams. The first optical element has a first surface on which the first second light beam are to be incident. The first light beam and the second light beam are incident on the first surface along a first direction such that the first light beam is incident at a first position on the first surface and the second light beam is incident at a second position on the first surface. The first light beam has a first width in a second direction intersecting the first direction on the first surface, and a second width in a third direction intersecting a plane including the first direction and the second direction on the first surface. The first width is greater than the second width. The second light beam has a third width in the second direction on the first surface, and a fourth width in the third direction on the first surface. The third width is greater than the fourth width. A direction from the second position to the first position intersects the third direction. The first light beam has a first peak wavelength, and the second light beam has a second peak wavelength different from the first peak wavelength of the first light beam. The first optical element has an optical power in the second direction greater than an optical power of the first optical element in the third direction.

19 Claims, 6 Drawing Sheets

(51) Int. Cl.
　　　*G03B 21/20*　　　(2006.01)
　　　*H01S 5/00*　　　(2006.01)
(52) U.S. Cl.
　　　CPC ......... *H01S 5/4012* (2013.01); *H04N 9/3152* (2013.01); *H04N 9/3161* (2013.01)

(56) References Cited

U.S. PATENT DOCUMENTS

| | | |
|---|---|---|
| 2004/0027631 A1 | 2/2004 | Nagano et al. |
| 2005/0063435 A1 | 3/2005 | Imai et al. |
| 2006/0126690 A1 | 6/2006 | Kido et al. |
| 2009/0303446 A1 | 12/2009 | Matsumoto |
| 2009/0323030 A1* | 12/2009 | Hazama ............. G02B 27/0944 353/38 |
| 2010/0110556 A1 | 5/2010 | Chann et al. |
| 2011/0249197 A1 | 10/2011 | Sprowl et al. |
| 2012/0257171 A1* | 10/2012 | Song ................. G03B 21/2033 353/52 |
| 2013/0215923 A1 | 8/2013 | Cobb |
| 2013/0258215 A1 | 10/2013 | Kaneda et al. |
| 2014/0078472 A1 | 3/2014 | Masuda et al. |
| 2015/0109583 A1 | 4/2015 | Inoko |
| 2016/0373704 A1 | 12/2016 | Akiyama |
| 2017/0207605 A1 | 7/2017 | Morita et al. |
| 2018/0019576 A1 | 1/2018 | Guo et al. |

FOREIGN PATENT DOCUMENTS

| | | |
|---|---|---|
| JP | 2000-251308 A | 9/2000 |
| JP | 2003-131231 A | 5/2003 |
| JP | 2004-38051 A | 2/2004 |
| JP | 2004-47650 A | 2/2004 |
| JP | 2004-96092 A | 3/2004 |
| JP | 2006-171348 A | 6/2006 |
| JP | 2009-294550 A | 12/2009 |
| JP | 2012-508453 A | 4/2012 |
| JP | 2013-213896 A | 10/2013 |
| JP | 2014-62951 A | 4/2014 |
| JP | 2015-508241 A | 3/2015 |
| JP | 2015-82025 A | 4/2015 |
| JP | 2017-009734 A | 1/2017 |
| JP | 2017-027903 A | 2/2017 |
| WO | WO 2016/013653 A1 | 1/2016 |

\* cited by examiner

LIGHT SOURCE MODULE

CROSS-REFERENCE TO RELATED APPLICATION

This application claims priority to Japanese Patent Application No. 2018-086460, filed on Apr. 27, 2018, the contents of which are hereby incorporated by reference in its entirety.

BACKGROUND OF THE INVENTION

1. Field of the Invention

The present disclosure relates to a light source module.

2. Description of Related Art

Light source modules are used in projectors and the like. A light source module is desired to have a uniform light intensity distribution (for example, see Japanese Unexamined Patent Application Publication No. 2014-62951).

SUMMARY OF THE INVENTION

Certain embodiments of the present invention allow for obtaining a light source module having a uniform light intensity distribution.

According to one embodiment of the present invention, a light source module includes a light source and a first optical element. The light source is configured to emit a first light beam and a second light beam. The first optical element has a first surface on which the first and second light beam are to be incident. The first light beam and the second light beam are incident on the first surface along a first direction such that the first light beam is incident at a first position on the first surface and the second light beam is incident at a second position on the first surface. The first light beam has a first width in a second direction intersecting the first direction on the first surface, and a second width in a third direction intersecting a plane including the first direction and the second direction on the first surface. The first width is greater than the second width. The second light beam has a third width in the second direction on the first surface, and a fourth width in the third direction on the first surface. The third width is greater than the fourth width. A direction from the second position to the first position intersects the third direction. The first light beam has a first peak wavelength, and the second light beam has a second peak wavelength different from the first peak wavelength of the first light beam. The first optical element has an optical power in the second direction greater than an optical power of the first optical element in the third direction.

According to certain embodiments of the present invention, a light source module having a uniform light intensity distribution can be provided.

DETAILED DESCRIPTION OF EMBODIMENTS

Figure 1:
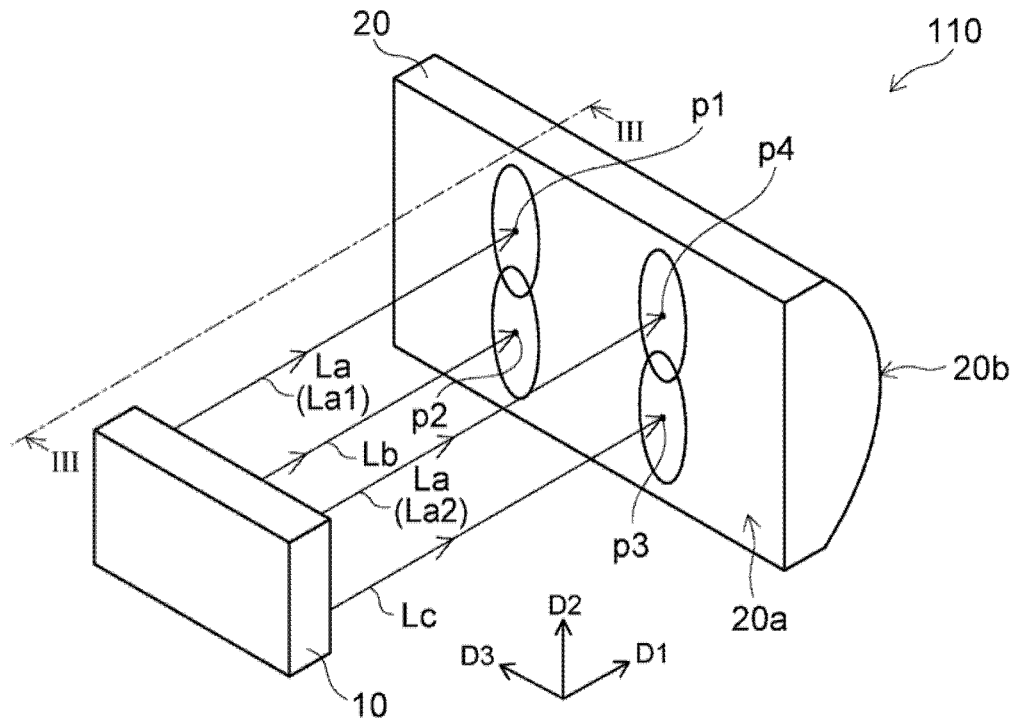
FIG. 1 is a schematic diagram showing an example of a light source module according to a first embodiment.

Certain embodiments of the present invention will be described below referring to the accompanying drawings.

The drawings are schematic or conceptual, and the relationship between a thickness and a width of each component, the ratio between sizes of components, etc., of the drawings are not necessarily the same as those of an actual product. Also, the dimensions and ratios of the same component in different drawings may be different from each other.

In the specification of the present application, an element that is the same as that described in a drawing that has been referred to is indicated with the same reference numeral, and its detailed description is omitted as appropriate.

First Embodiment

Figure 2:
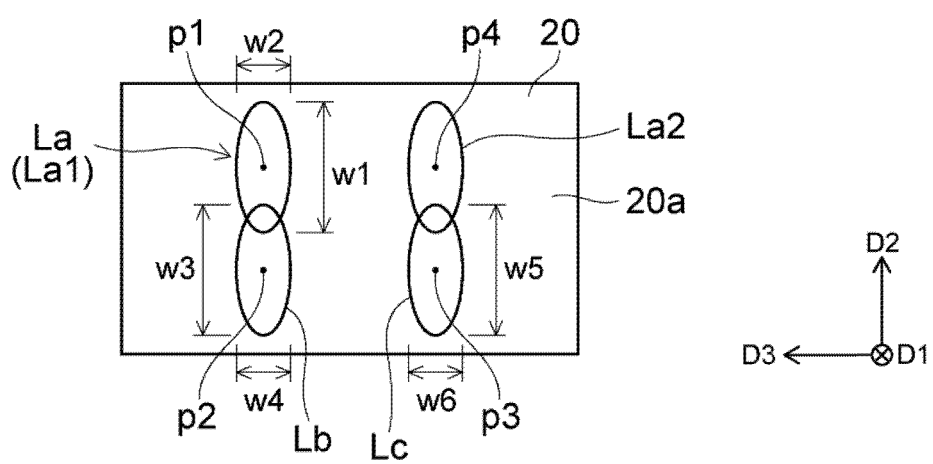
FIG. 2 is a schematic diagram showing an example of the light source module according to the first embodiment.
Figure 3:
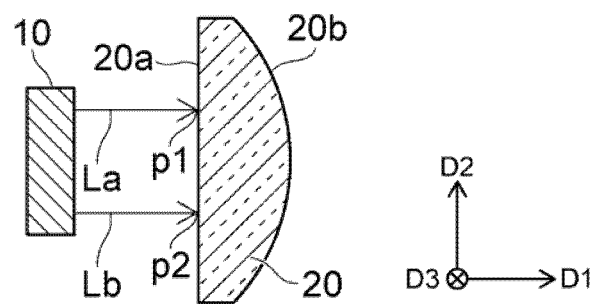
FIG. 3 is a schematic diagram showing an example of the light source module according to the first embodiment.

FIG. 1 to FIG. 3 are schematic diagrams illustrating a light source module according to a first embodiment.

FIG. 1 is a schematic perspective view. FIG. 2 is a schematic plan view. FIG. 3 is a schematic sectional view taken along the line of FIG. 1.

As shown in FIG. 1, a light source module 110 according to certain embodiments includes a light source 10 and a first optical element 20. The light source 10 is configured to emits a first light beam La and a second light beam Lb. In this example, the light source 10 is configured to further emit a third light beam Lc. In certain embodiments, a plurality of first light beams La, a plurality of second light beams Lb, and a plurality of third light beams Lc may be emitted. In this example, a plurality of first light beams La (light beam La1 and light beam La2) are illustrated.

The first light beams La has a first peak wavelength different from a second peak wavelength of the second light beam Lb. The third light beam Lc has a third peak wavelength different from the first peak wavelength and different from the second peak wavelength. In one example, the third peak wavelength is between the first peak wavelength and the second peak wavelength.

In one example, the first peak wavelength is longer than the second peak wavelength. For example, the first light beams La are red light, the second light beam Lb is blue light, and the third light beam Lc is green light.

The first peak wavelength is, for example, in the range of 600 nm to 650 nm. The second peak wavelength is, for example, 440 nm or more and less than 490 nm. The third peak wavelength is, for example, 500 nm or more and less than 550 nm. For example, the first to third light beams La to Lc are laser beams. These light beams are incident on the first optical element 20 in far field patterns.

The first optical element 20 has a first surface 20a and a second surface 20b. The first light beams La and the second light beam Lb are incident on the first surface 20a. When the third light beam Lc is emitted from the light source 10, the third light beam Lc is incident on the first surface 20a. The first to third light beams La to Lc are emitted from the second surface 20b. The first surface 20a is, for example, an incidence surface. The second surface 20b is, for example, an emission surface. For example, glass or a plastic is used for the first optical element 20.

The first light beam La (such as the light beam La1) and the second light beam Lb are incident on the first surface 20a along a first direction D1. When the third light beam Lc is emitted from the light source 10, the third light beam Lc is incident on the first surface 20a along the first direction D1. The first to third light beams La to Lc spread. A direction of the principal axis (i.e., axis along which the intensity is highest) of each of first to third light beams La to Lc is referred to as the direction of propagation of the light beam. The principal axis of each of first to third light beams La to Lc is substantially parallel to the first direction D1.

The first light beam La (such as the light beam La1) has a first width w1 in a second direction D2 on the first surface 20a and a second width w2 in a third direction D3 on the first surface 20a. The first width w1 is greater than the second width w2. The second direction D2 intersects the first direction D1. For example, the angle defined by the second direction D2 and the first direction D1 is in the range of 85 degrees to 95 degrees. For example, the second direction D2 is substantially perpendicular to the first direction D1. The third direction D3 intersects the plane (D1-D2 plane) including the first direction D1 and the second direction D2. For example, the angle defined by the third direction D3 and D1-D2 plane is in the range of 85 degrees to 95 degrees. For example, the third direction D3 is substantially perpendicular to D1-D2 plane.

The second light beam Lb has a third width w3 in the second direction D2 on the first surface 20a and a fourth width w4 in the third direction D3 on the first surface 20a. The third width w3 is greater than the fourth width w4.

When the third light beam Lc is emitted, the third light beam Lc has a fifth width w5 in the second direction D2 on the first surface 20a and a sixth width w6 in the third direction D3 on the first surface 20a. The fifth width w5 is greater than the sixth width w6.

When a plurality of first light beams La (such as the light beam La1 and the light beam La2) are emitted, the width of each of the first light beams La is greater in the second direction D2 than in the third direction D3.

In one example, the first width w1 is the maximum width of the first light beam La on the first surface 20a, and the second width w2 is the minimum width of the first light beam La on the first surface 20a. In one example, the third width w3 is the maximum width of the second light beam Lb on the first surface 20a, and the fourth width w4 is the minimum width of the second light beam Lb on the first surface 20a. In one example, the fifth width w5 is the maximum width of the third light beam Lc on the first surface 20a, and the sixth width w6 is the minimum width of the third light beam Lc on the first surface 20a.

As shown in FIG. 1 and FIG. 2, the first light beam La (such as the light beam La1) is incident at a first position p1 on the first surface 20a. The second light beam Lb is incident at a second position p2 on the first surface 20a. When the third light beam Lc is emitted, the third light beam Lc is incident at a third position p3 on the first surface 20a. When a plurality of first light beams La are emitted, one light beam (e.g., the light beam La1) of the first light beams La is incident at the first position p1. Another light beam (e.g., the light beam La2) of the first light beams La is incident at a fourth position p4.

As shown in FIG. 2, on the first surface 20a, the first to third light beams La1 to Lc have substantially elliptic shapes. For example, the intersection of the major axis and the minor axis of the ellipse of each of the first to third light beams La1 to Lc is referred to as a position on the first surface 20a on which a respective one of the first to third light beams La1 to Lc is incident (i.e., a respective one of first to fourth positions p1 to p4).

The direction from the second position p2 to the first position p1 intersects the third direction D3. For example, the direction from the second position p2 to the first position p1 may lie along the second direction D2. For example, the direction from the third position p3 to the second position p2 lies along the third direction D3. For example, the direction from the fourth position p4 to the first position p1 lies along the third direction D3. In certain embodiments, the direction from the third position p3 to the second position p2 may be inclined with respect to the direction from the second position p2 to the first position p1.

As shown in FIG. 1 and FIG. 3, in the certain embodiments, the first optical element 20 has an optical power in the second direction D2 greater than an optical power of the first optical element 20 in the third direction D3. The "optical power" as used herein refers to the "refractive power". For example, in one example, the first surface 20a is substantially flat. On the other hand, the second surface 20b is substantially a portion of a circular cylinder.

The axis of the circular cylinder is along the third direction D3. For example, the curvature of the second surface 20b in the D1-D2 cross section is greater than the curvature of the second surface 20b in the D1-D3 cross section. For example, the radius of curvature of the second surface 20b in the D1-D2 cross section is smaller than the radius of curvature of the second surface 20b in the D1-D3 cross section. In the D1-D3 cross section, the second surface 20b may form a substantially straight line.

The light beams La to Lc as described above emitted from the light source 10 enter the first optical element 20 through the first surface 20a and are emitted from the second surface 20b. As described below, after emitted from the second surface 20b, these light beams La to Lc are superposed on one another using, for example, a plurality of mirrors and enter a fly's-eye lens (such as an integrator). In the first embodiment, the optical power of the first optical element 20 in the second direction D2 is increased, and accordingly spread of the light beams in the second direction D2 are reduced. For example, the light beams La to Lc become close to parallel rays in the second direction D2, or for example, the light beams are substantially collimated. For example, the first light beam La and the second light beam Lb are superposed on each other using a plurality of mirrors, and the first and second beams La and Lb can be optically regarded as substantially parallel rays emitted from a single point. When the first and second beams La and Lb that are combined are incident on the fly's-eye lens, the combined light beams are divided according to the number of divisions of the fly's-eye lens, so that light divided in an appropriate number with uniform light intensity can be obtained.

On the other hand, the first optical element 20 has a smaller optical power in the third direction D3. In the third direction D3, the degree of spread of each light beam emitted from the first optical element 20 is determined by the degree of directivity of the light beam when emitted from the light source 10. This structure allows for obtaining an appropriate number of images. For example, when the light beams La to Lc are incident on the fly's-eye lens, the light beams La to Lc are divided according to the number of divisions of the fly's-eye lens, so that light beams divided in an appropriate number of divisions with high uniformity can be obtained.

As has already been described, a plurality of first light beams La may be incident on the first optical element 20. The incidence positions (and emitting positions) of the first light beams La on the first optical element 20 differ from each other in the third direction D3. With incidence positions (and emitting positions) on the first optical element 20 differing from each other in the third direction D3, the fly's-eye lens allows for easily obtaining an appropriate number of images and with good uniformity in light intensity. As described below, for example, a lens that allows for narrowing the directivity in the third direction D3 to such a degree that the light beams are not collimated may be disposed.

In certain embodiments, a straight line passing through the midpoint between the first position p1 and the second position p2 and extending along the first direction D1 substantially corresponds to the optical axis of the second surface 20b.

In the certain embodiments, the distance between the first position p1 and the fourth position p4 (i.e., length along the third direction D3) may correspond to or differ from the distance between the second position p2 and the third position p3 (i.e., length along the third direction D3).

An example of a projector employing the light source module 110 according to certain embodiments will be described below.

Figure 4:
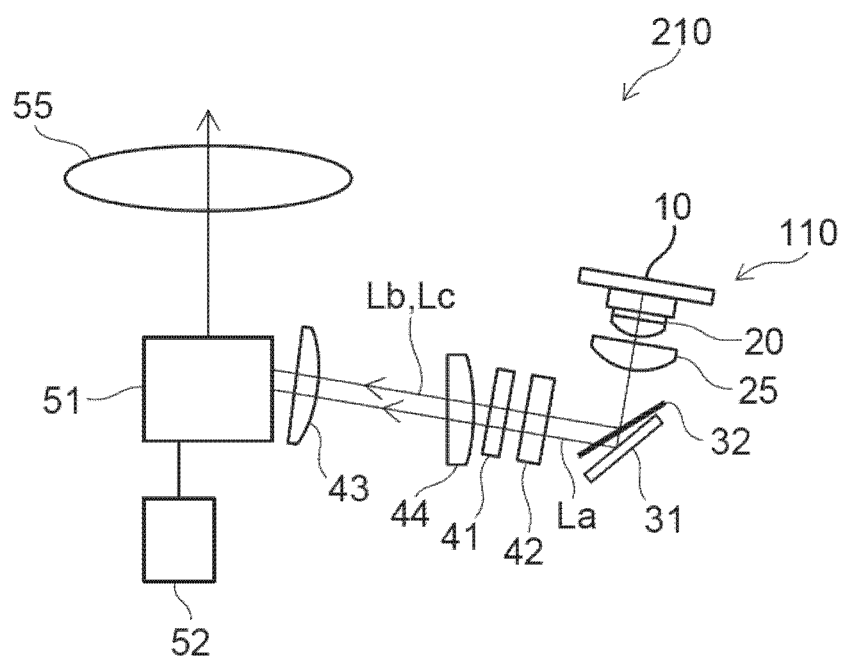
FIG. 4 is a schematic diagram showing an example of a projector employing the light source module according to certain embodiments.

FIG. 4 is a schematic diagram showing an example of the projector employing the light source module according to certain embodiments.

As shown in FIG. 4, a projector 210 includes the light source module 110. In this example, the light source module 110 includes a first mirror 31 and a second mirror 32 in addition to the light source 10 and the first optical element 20.

For example, in the optical path of at least portions of the light beams emitted from the first optical element 20, the second mirror 32 is disposed between the first optical element 20 and the first mirror 31. For example, portions of the light beams emitted from the first optical element 20 passes through the second mirror 32 and is reflected by the first mirror 31. For example, another portions of the light beams emitted from the first optical element 20 is reflected by the second mirror 32.

For example, the second light beam Lb and the third light beam Lc emitted from the first optical element 20 are incident on the second mirror 32. The second light beam Lb and the third light beam Lc are reflected by the second mirror 32. On the other hand, the first light beam La emitted from the first optical element 20 passes through the second mirror 32 and is incident on and reflected by the first mirror 31.

The incidence angle of the first light beam La incident on the first mirror 31 differs from the incidence angle of the second light beam Lb incident on the second mirror 32 and differs from the incidence angle of the third light beam Lc incident on the second mirror 32.

The first mirror 31 is, for example, a dichroic mirror. For example, the first mirror 31 is configured to transmit red light and to reflect green light and blue light. For example, the transmittance of red light of the first mirror 31 is higher than the transmittance of green light of the first mirror 31 and higher than the transmittance of blue light of the first mirror 31. The reflectance of green light of the first mirror 31 is higher than the reflectance of red light of the first mirror 31. The reflectance of blue light of the first mirror 31 is higher than the reflectance of red light of the first mirror 31. These two mirrors superpose the first to third light beams La to Lc on one another. The superposed first to third light beams La to Lc provides substantially white light.

In this example, the projector 210 further includes a fly's-eye lens 41. The first light beam La reflected by the first mirror 31 and the second and third light beams Lb and Lc reflected by the second mirror 32 are incident on the fly's-eye lens 41. When the first to third beams La to Lc pass through the fly's-eye lens 41, the first to third beams La to Lc are divided according to the number of divisions of the fly's-eye lens, so that uniform light divided into an appropriate number of divisions can be obtained.

The light beam that has passed through the fly's-eye lens 41 enters, for example, a light modulator 51. The light modulator 51 is configured to modulate the intensity of the light entering the light modulator 51 and to emit the obtained light. The light modulator 51 includes, for example, a digital micromirror device (DMD). A data processor 52 (such as a computer) sends an image signal to the light modulator 51. The light modulator 51 performs modulation according to the image signal. The light modulated by the light modulator 51 passes through a projection lens 55 and travels toward, for example, a projection screen. A desired image is formed on the projection screen. In this example, a lens 43 is provided in the optical path between the fly's-eye lens 41 and the light modulator 51. The lens 43 is a field lens, for example, and can control an incident angle of a light on light modulator 51. As shown in FIG. 4, a lens 44 can be provided in the optical path between the fly's-eye lens 41 and the lens 43. The lens 44 is a condenser lens, for example, and can superimpose a light from the fly's-eye lens 41 on the light modulator 51.

In the first embodiment, the light beams (i.e., first to third light beams La to Lc) reflected by the mirrors (i.e., first mirror 31 and second mirror 32) are incident on the fly's-eye lens 41 to be divided according to the number of divisions of the fly's-eye lens, so that uniform light divided into an appropriate number of divisions is efficiently obtained. A projector that can perform uniform display is obtained.

The light source module 110 may include the fly's-eye lens 41.

As shown in FIG. 4, in this example, the light source module 110 further includes an additional optical element 25 in addition to the light source 10, the first optical element 20, the first mirror 31, and the second mirror 32. The additional optical element 25 is disposed in the optical path between the first optical element 20 and the second mirror 32. The additional optical element 25 is, for example, a cylindrical lens. The axis of the cylindrical additional optical element 25 lies along the third direction D3 of the first optical element 20. With the additional optical element 25, for example, the optical power in the second direction D2 can be further increased. The combination of the first optical element 20 and the additional optical element 25 may be referred to as the "first optical element".

As shown in FIG. 4, in this example, a second optical element 42 is disposed in the optical path between the mirrors (first mirror 31 and second mirror 32) and the fly's-eye lens 41. The fly's-eye lens 41 is provided in the optical path between the lens 44 and the second optical element 42. An example of the second optical element 42 will be described below.

Figure 5:
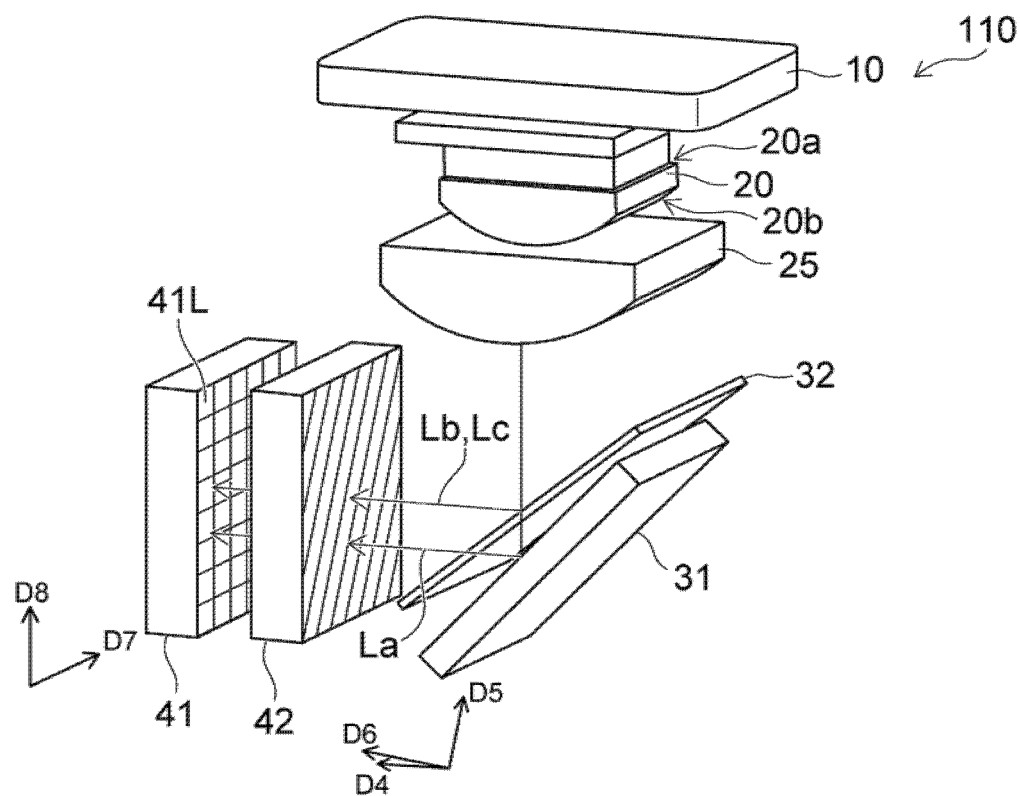
FIG. 5 is a schematic diagram showing an example of the projector according to certain embodiments.
Figure 6:
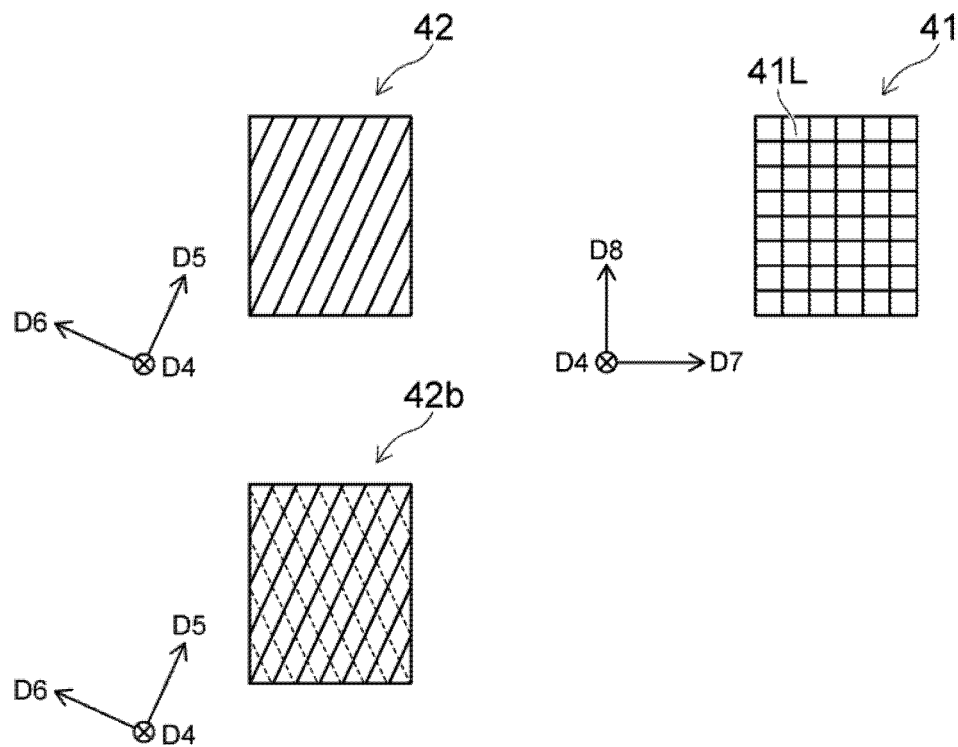
FIG. 6 is a schematic diagram showing an example of the projector according to certain embodiments.

FIG. 5 and FIG. 6 are schematic diagrams illustrating the projector according to certain embodiments.

As shown in FIG. 5, for example, each light beam reflected by a corresponding one of the mirrors (i.e., a corresponding one of the first mirror 31 and the second mirror 32) is incident on the second optical element 42. The light beams incident on the second optical element 42 pass through the second optical element 42 and are incident on the fly's-eye lens 41.

As shown in FIG. 5, the first light beam La (and the second and third light beams Lb and Lc) is incident on the second optical element 42 along a fourth direction D4.

FIG. 6 schematically shows the second optical element 42 and the fly's-eye lens 41 viewed in the fourth direction D4.

As shown in FIG. 5 and FIG. 6, a direction intersecting the fourth direction D4 is referred to as a fifth direction D5. A direction intersecting the plane including the fourth direction D4 and the fifth direction D5 (i.e., D4-D5 plane) is referred to as a sixth direction D6. In one example, the fifth direction D5 may be perpendicular to the fourth direction D4. In one example, the sixth direction D6 may be perpendicular to the fourth direction D4 and the fifth direction D5.

For example, the optical properties of the second optical element 42 in the fifth direction D5 differ from the optical properties of the second optical element 42 in the sixth direction D6. For example, the optical properties of the second optical element 42 are anisotropic in the D5-D6 plane.

As shown in FIG. 5 and FIG. 6, the fly's-eye lens 41 includes a plurality of lenses 41L arranged along a seventh direction D7 and an eighth direction D8. For example, the seventh direction D7 and the eighth direction D8 intersect the fourth direction D4. For example, the seventh direction D7 and the eighth direction D8 are perpendicular to the fourth direction D4. For example, the eighth direction D8 is substantially perpendicular to the seventh direction D7.

As shown in FIG. 6, the seventh direction D7 is inclined with respect to the fifth direction D5 and the sixth direction D6. The eighth direction D8 is inclined with respect to the fifth direction D5 and the sixth direction D6.

For example, without the second optical element 42, a plurality of light beams emitted from the light source 10 and pass through the fly's-eye lens 41 may have uneven intensity. For example, unevenness in intensity of light is attributable to interference (such as moiré). In certain embodiments, the inclination of the direction of optical anisotropy of the second optical element 42 with respect to the direction of optical anisotropy of the fly's-eye lens 41 reduces the interference. This structure allows for obtaining light with more uniform intensity.

The second optical element 42 may periodically move along a direction intersecting the fourth direction D4 at a frequency of equal to or less than the response time of human vision. For example, the second optical element 42 is vibrated. The frequency of the vibration is equal to or less than the response time of human vision. In one example, the frequency of the vibration is 80 Hz or more. Periodic movement of the second optical element 42 allows for easily obtaining more uniform light.

As shown in FIG. 6, another optical element 42b, which is another example of the second optical element 42, may be provided with a cylindrical lens array arranged along the fifth direction D5 on a first surface of the optical element 42b and be provided with a cylindrical lens array arranged along a direction inclined with respect to the fifth direction D5 on a second surface of the optical element 42b.

Figure 7:
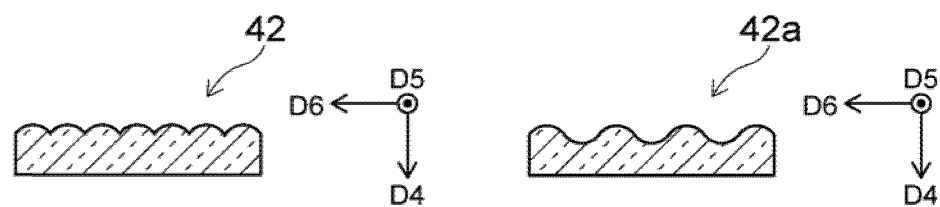
FIG. 7 is a schematic sectional view showing an example of a part of the projector according to certain embodiments.

FIG. 7 is a schematic sectional view showing an example of a portion of the projector according to certain embodiments.

FIG. 7 illustrates cross-sections of the second optical element 42. In one example of the second optical element 42, the second optical element 42 is a cylindrical lens array. For example, a surface (such as the main surface) of the second optical element 42 includes a plurality of columnar lenses. The columnar lenses extend along, for example, the fifth direction D5.

As shown in FIG. 7, in an optical element 42a, which is another example of the second optical element 42, a surface (such as the main surface) of the optical element 42a has a sinusoidal shape in a section along the D4-D6 plane.

For example, the optical power of the second optical element 42 in the fifth direction D5 differs from the optical power of the second optical element 42 in the sixth direction D6, and the optical power of the optical element 42a in the fifth direction D5 differs from the optical power of the optical element 42a in the sixth direction D6. With the second optical element 42 (or the optical element 42a), more uniform light can be easily obtained.

An example of the light source 10 will be described below.

Figure 8:
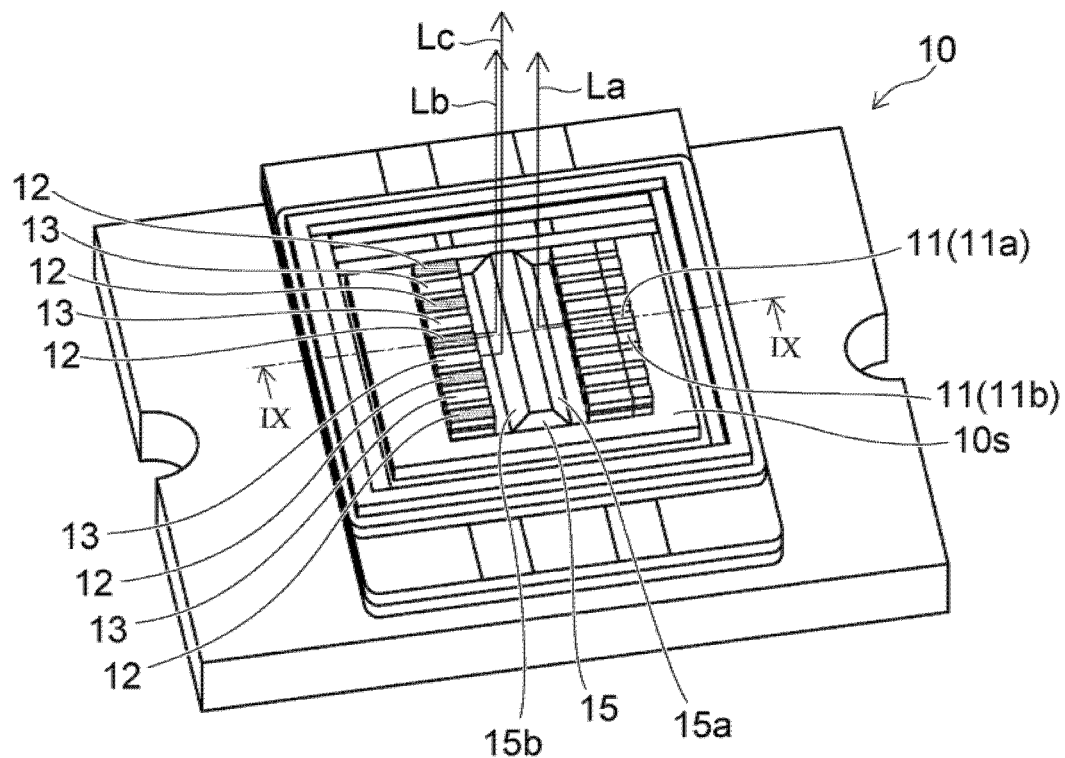
FIG. 8 is a schematic perspective view showing an example of a portion of the light source module according to certain embodiments.
Figure 9:
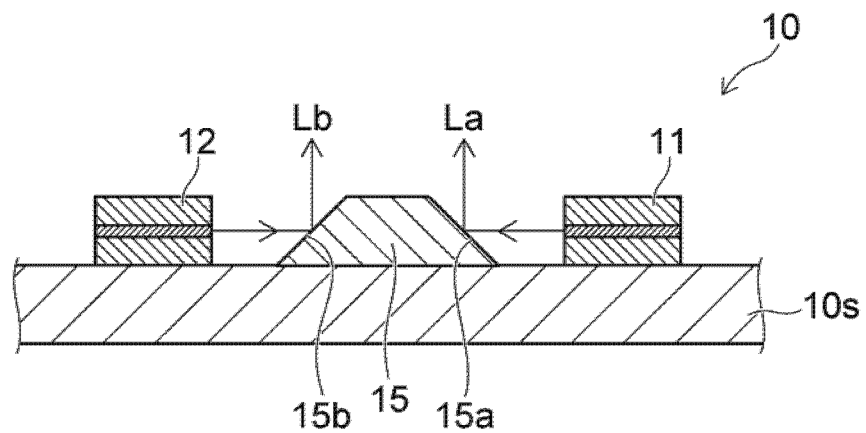
FIG. 9 is a schematic cross-sectional view showing an example of a part of the light source module according to certain embodiments.

FIG. 8 is a schematic perspective view showing a portion of the light source module according to certain embodiments. FIG. 9 is a schematic cross-sectional view taken along the line IX-IX of FIG. 8.

As shown in FIG. 8, at least one first light source 11, at least one second light source 12, at least one third light source 13, a first reflection surface 15a, and a second reflection surface 15b are disposed on a base member 10s (such as a substrate). In this example, a plurality of first light sources 11 (i.e., a first light source 11a, a first light source 11b, and other first light sources) are disposed. In this example, a plurality of second light sources 12 and a plurality of third light sources 13 are disposed. The first light sources 11 are aligned in a single direction, which corresponds to, for example, the third direction D3 (see FIG. 1). The second light sources 12 and the third light sources 13 are alternately aligned in the single direction. The first light sources 11 are configured to emit the first light beam La. The second light sources 12 are configured to emit the second light beam Lb. The third light sources 13 are configured to emit the third light beam Lc.

The first reflection surface 15a is disposed between the at least one first light source 11 (corresponding one or more of the first light sources 11) and the at least one second light source 12 (corresponding one or more of the second light sources 12). The first light beam La is incident on the first reflection surface 15a.

The second reflection surface 15b is disposed between the first reflection surface 15a and the at least one second light source 12 (corresponding one or more of the second light sources 12). The second light beam Lb is incident on the second reflection surface 15b. In this example, the third light beam Lc is also incident on the second reflection surface 15b.

As shown in FIG. 8, a protrusion 15 having two inclined surfaces is disposed between the first light sources 11 and the second light sources 12 and between the first light sources 11 and the third light sources 13. One of two inclined surfaces of the protrusion 15 corresponds to the first reflection surface 15a. The other of the two inclined surfaces of the protrusion 15 corresponds to the second reflection surface 15b.

As shown in FIG. 9, for example, the first light beam La is emitted from the first light sources 11 toward the first reflection surface 15a. The first light beam La is reflected by the first reflection surface 15a and travels substantially perpendicularly to the main surface of the base member 10s. For example, the second light beam Lb is emitted from the second light sources 12 toward the second reflection surface 15b. The second light beam Lb is reflected by the second reflection surface 15b and travels substantially perpendicularly to the main surface of the base member 10s. Similarly, for example, the third light beam Lc is emitted from the third light sources 13 toward the second reflection surface 15b (not shown in FIG. 9). The third light beam Lc is reflected by the second reflection surface 15b and travels substantially perpendicularly to the main surface of the base member 10s (see FIG. 8). The optical axes of the first to third light beams La to Lc are substantially parallel to one another. The first to third light beams La to Lc are incident on the first optical element 20 (see FIG. 1).

The first to third light sources 11 to 13 are, for example, lasers. For the first reflection surface 15a and the second reflection surface 15b, for example, a reflection surface of a metal film or a dielectric multilayer film can be used. The incidence angle of the first light beam La with the first reflection surface 15a is, for example, in the range of 40 degrees to 50 degrees. The incidence angle of the second light beam Lb with the second reflection surface 15b is, for example, in the range of 40 degrees to 50 degrees. The incidence angle of the third light beam Lc with the second reflection surface 15b is, for example, in the range of 40 degrees to 50 degrees.

Second Embodiment

In a second embodiment, the first surface 20a of the first optical element 20 has a shape that allows for having an optical power.

Figure 10:
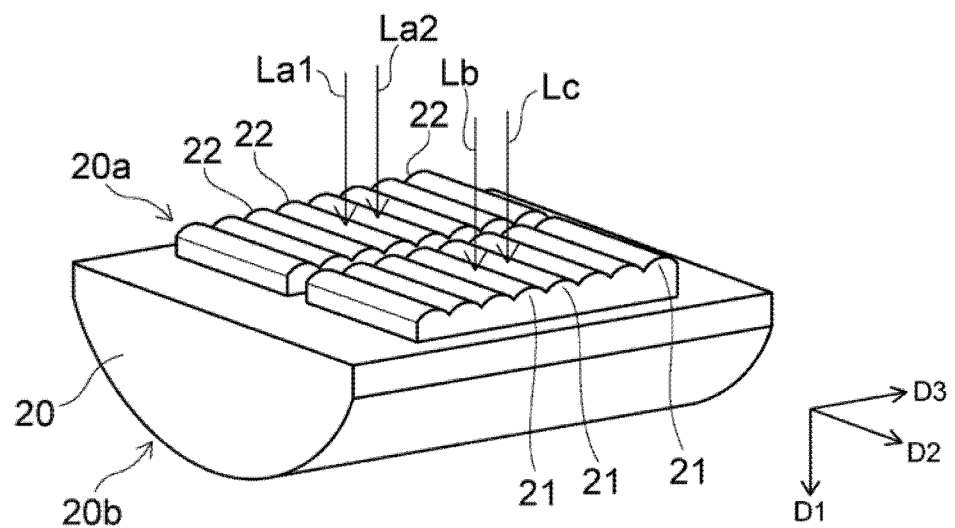
FIG. 10 is a schematic perspective view showing an example of a part of a light source module according to a second embodiment.

FIG. 10 is a schematic perspective view showing an example of a portion of a light source module according to the second embodiment.

In FIG. 10, illustration of the light source 10 is omitted. As shown in FIG. 10, the first optical element has a first surface 20a and a second surface 20b. The first to third light beams La to Lc are incident on the first surface 20a. In this example, the first surface 20a includes a plurality of first optical regions 21. The second light beam Lb is incident on a corresponding one of the first optical regions 21. The third light beam Lc is incident on another corresponding one of the first optical regions 21. The first optical region 21 on which the second light beam Lb is incident includes a lens and/or a prism. The first optical region 21 on which the third light beam Lc is incident includes a lens and/or a prism.

In this example, the first optical regions 21 include a plurality of lenses. The plurality of lenses of the first optical regions 21 are, for example, cylindrical lenses. A plurality of columnar portions of the cylindrical lenses extend along the second direction D2. The columnar portions of the cylindrical lenses are aligned in the third direction D3. For example, the direction from the other one of the first optical regions 21 described above to the one of the first optical regions 21 described above lies along the third direction D3.

For example, the first optical regions 21 narrows the directivity of the second light beam Lb to such a degree that the light beam is not collimated. The first optical region 21 narrows the directivity of the third light beam Lc to such a degree that the light beam is not collimated. These light beams can be efficiently incident on the fly's-eye lens 41 spreading at a desired degree.

As shown in FIG. 10, one of the first optical regions 21 corresponds to a corresponding one of the plurality of second light beams Lb or a corresponding one of the plurality of third light beams Lc. In an example, the surface of each of the first optical regions 21 is a curved (cylindrical) surface.

As shown in FIG. 10, when the light source 10 emits a plurality of first light beams La, the first light beams La are incident on the first surface 20a at positions aligned in, for example, the third direction D3. For example, the direction from an incident position of one of the first light beams La (i.e., a light beam La1) on the first surface 20a to an incident position of another one of the first light beams La (i.e., a light beam La2) on the first surface 20a lies along the third direction D3.

As shown in FIG. 10, the first surface 20a of the first optical element 20 may be provided with a plurality of second optical regions 22. One of the first light beams La (e.g., the light beam La1) is incident on a corresponding one of the second optical regions 22. Another one of the first light beams La (e.g., the light beam La2) is incident on corresponding another one of the second optical regions 22. The one of the second optical regions 22 includes a lens and/or a prism. The another one of the second optical regions 22 includes a lens and/or a prism. Each of the second optical regions 22 has, for example, a curved surface (e.g., each of the second optical regions 22 has a cylindrical-lens shape). The direction from the other one of the second optical regions 22 above to the one of the second optical regions 22 described above lies along the third direction D3.

The second optical regions 22 can narrow the directivity of the first light beams La to such a degree that the light beams are not collimated. Accordingly, the first light beams La can be efficiently incident on, for example, the fly's-eye lens 41 with a desired degree of spread.

In certain embodiments, the pitch (i.e., length along the third direction D3) of the first optical regions 21 may be the same as or different from the pitch (i.e., length along the third direction D3) of the second optical regions 22.

Figure 11:
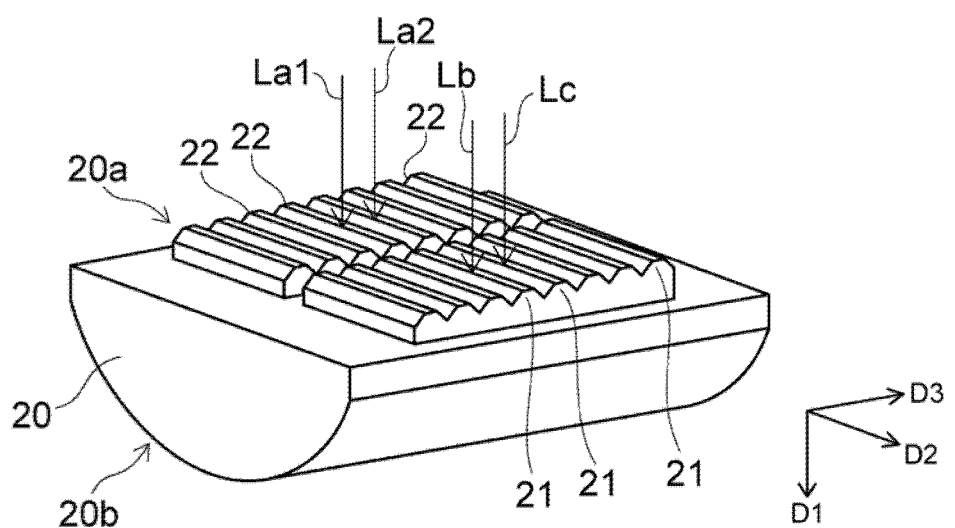
FIG. 11 is a schematic perspective view showing an example of a part of another light source module according to the second embodiment.

FIG. 11 is a schematic perspective view showing an example of a portion of another light source module according to the second embodiment.

A cross-section of each of the first optical regions 21 along the D1-D3 plane may have a substantially trapezoidal shape as shown in FIG. 11. Each of the first optical regions 21 may have an inclined surface (for example, each of the first optical regions 21 may have a shape like a portion of a prism). A cross-section of each of the second optical regions 22 along the D1-D3 plane may have a substantially trapezoidal shape. Each of the second optical regions 22 may have an inclined surface (for example, each of the second optical regions 22 may have a shape like a portion of a prism). Such a first surface 20a also controls the spread of light beams (such as the first to third light beams La to Lc). For example, the first and second optical regions 21 and 22 narrows the directivity of light to such a degree that the light is not collimated. The light can be efficiently incident on, for example, the fly's-eye lens 41 with a desired degree of spread.

In certain embodiments, for example, semiconductor lasers are configured to emit a plurality of light beams (such as the first to third light beams La to Lc) with different wavelengths. The plurality of light beams are substantially parallel to one another. The plurality of light beams (such as a plurality of first light beams La, a plurality of second light beams Lb, and a plurality of third light beams Lc) are incident on the first optical element 20. For example, the directions of the slow axes of the plurality of light beams are substantially the same. The plurality of light beams include light beams of a first group and light beams of a second group. The light beams of a first group include a plurality of first light beams La. The light beams of a second group include a plurality of second light beams Lb and a plurality of third light beams Lc. The first light beams La are aligned in the third direction D3. The second light beams Lb and the third light beams Lc are alternately aligned in the third direction D3. These light beams (i.e., laser beams) are incident on the first optical element 20. The generatrix axis of the first optical element 20 lies along the slow axes of these light beams (laser beams). The direction from incident positions of the second light beams Lb on the first surface 20a to incident positions of the first light beams La on the first surface 20a lie along the second direction D2. The optical power of the first optical element 20 in the second direction D2 is greater than the optical power of the first optical element 20 in the third direction D3. For example, a straight line passing through the midpoint between an incident position of each of the light beams of the first group on the first surface 20a and an incident position of a corresponding one of the light beams of the second group on the first surface 20a and lying along the first direction D1 substantially corresponds to the optical axis of the second surface 20b.

According to certain embodiments, a light source module having a uniform light intensity distribution can be obtained.

In the specification of the present application, the expressions "perpendicular" and "parallel" refer to not only a strictly perpendicular configuration and a strictly parallel configuration, but also include, for example, a configuration slightly deviated from a strictly perpendicular configuration and a configuration slightly deviated from a strictly parallel configuration due to manufacturing processes, etc. That is, the terms "perpendicular" and "parallel" encompass substantially perpendicular and substantially parallel configurations, respectively.

Certain embodiments of the present invention have been described above referring to specific examples. However, the scope of the present invention is not limited to those specific examples. For example, specific structures of the light source, the light sources, the reflection surfaces, the optical elements, and the mirrors included in the light source module may be appropriately selected from known art by a person skilled in the art, and variations of such specific configurations are within the scope of the present invention as long as a person skilled in the art can implement the present invention in a similar manner and can obtain similar effects.

Further, two or more elements combined to the extent technically possible in the specific examples are also within the scope of the present invention as long as the combination of the two or more elements involves the gist of the present invention.

Further, all light source modules that can be obtained through appropriate changes in design made by a person skilled in the art on the basis of the light source module described above in certain embodiments of the present invention are within the scope of the present invention as long as the light source modules involve the gist of the present invention.

Various modifications and variations can be made by a person skilled in the art within the idea of the present invention. Therefore, those variations and modifications also fall within the scope of the present invention.

What is claimed is:

1. A light source module comprising:
   a light source configured to emit a first light beam and a second light beam; and
   a first optical element having a first surface on which the first light beam and the second light beam are to be incident,
   wherein
   the first light beam and the second light beam are incident on the first surface along a first direction such that the first light beam is incident at a first position on the first surface and the second light beam is incident at a second position on the first surface,
   the first light beam has a first width in a second direction intersecting the first direction on the first surface, and a second width in a third direction intersecting a plane including the first direction and the second direction on the first surface,
   the first width is greater than the second width,
   the second light beam has a third width in the second direction on the first surface, and a fourth width in the third direction on the first surface,
   the third width is greater than the fourth width,
   a direction from the second position to the first position intersects the third direction,
   the first light beam has a first peak wavelength,
   the second light beam has a second peak wavelength different from the first peak wavelength of the first light beam,
   the first optical element has an optical power in the second direction greater than an optical power of the first optical element in the third direction, and
   the second light beam is adjacent to the first light beam along the second direction among light beams emitted from the light source.

2. The light source module according to claim 1, wherein the light source comprises:
   a first light source configured to emit the first light beam;
   a second light source configured to emit the second light beam;
   a first reflection surface on which the first light beam is incident, the first reflection surface being disposed between the first light source and the second light source; and
   a second reflection surface on which the second light beam is incident, the second reflection surface disposed between the first reflection surface and the second light source.

3. The light source module according to claim 1, wherein the first light beam and the second light beam are laser beams.

4. A light source module comprising:
   a light source configured to emit a first light beam and a second light beam; and
   a first optical element having a first surface on which the first light beam and the second light beam are to be incident,
   wherein
   the first light beam and the second light beam are incident on the first surface along a first direction such that the first light beam is incident at a first position on the first surface and the second light beam is incident at a second position on the first surface, the first light beam has a first width in a second direction intersecting the first direction on the first surface, and a second width in a third direction intersecting a plane including the first direction and the second direction on the first surface, the first width is greater than the second width, the second light beam has a third width in the second direction on the first surface, and a fourth width in the third direction on the first surface, the third width is greater than the fourth width, a direction from the second position to the first position intersects the third direction, the first light beam has a first peak wavelength, the second light beam has a second peak wavelength different from the first peak wavelength of the first light beam, and the first optical element has an optical power in the second direction greater than an optical power of the first optical element in the third direction, wherein the light source is configured to further emit a third light beam, wherein the third light beam has a third peak wavelength different from the first peak wavelength of the first light beam and different from the second peak wavelength of the second light beam, wherein the third light beam is incident on the first surface of the first optical element along the first direction, wherein the third light beam has a fifth width in the second direction on the first surface and a sixth width in the third direction on the first surface, and wherein the fifth width is greater than the sixth width.

5. The light source module according to claim 4, wherein the third light beam is incident at a third position on the first surface, and wherein a direction from the third position to the second position lies along the third direction.

6. The light source module according to claim 5, wherein the first surface comprises a plurality of first optical regions, wherein the second light beam is incident on a corresponding one of the plurality of first optical regions, wherein the third light beam is incident on another corresponding one of the plurality of first optical regions, wherein the first optical region corresponding to the second light beam comprises a lens and/or a prism, and wherein the first optical region corresponding to the third light beam comprises at least one of a lens and/or a prism.

7. The light source module according to claim 4, wherein the third peak wavelength is between the first peak wavelength and the second peak wavelength.

8. The light source module according to claim 4, wherein the first surface comprises a plurality of first optical regions, wherein the second light beam is incident on a corresponding one of the plurality of first optical regions, wherein the third light beam is incident on another corresponding one of the plurality of first optical regions, wherein the first optical region corresponding to the second light beam comprises a lens and/or a prism, and wherein the first optical region corresponding to the third light beam comprises at least one of a lens and/or a prism.

9. The light source module according to claim 8, wherein a direction from the first optical region corresponding to the third light beam to the first optical region corresponding to the second light beam lies along the third direction.

10. The light source module according to claim 4, the light source module further comprising:

a first mirror on which the first light beam emitted from the first optical element is incident; and a second mirror on which the second light beam and the third light beam emitted from the first optical element are incident, wherein an incidence angle of the first light beam incident on the first mirror differs from an incidence angle of the second light beam incident on the second mirror and differs from an incidence angle of the third light beam incident on the second mirror.

11. The light source module according to claim 4, the light source module further comprising:

a first mirror on which the first light beam emitted from the first optical element is incident; and a second mirror on which the second light beam emitted from the first optical element is incident, wherein an incidence angle of the first light beam incident on the first mirror differs from an incidence angle of the second light beam incident on the second mirror.

12. A light source module comprising:

a light source configured to emit a first light beam and a second light beam; and a first optical element having a first surface on which the first light beam and the second light beam are to be incident, wherein the first light beam and the second light beam are incident on the first surface along a first direction such that the first light beam is incident at a first position on the first surface and the second light beam is incident at a second position on the first surface, the first light beam has a first width in a second direction intersecting the first direction on the first surface, and a second width in a third direction intersecting a plane including the first direction and the second direction on the first surface, the first width is greater than the second width, the second light beam has a third width in the second direction on the first surface, and a fourth width in the third direction on the first surface, the third width is greater than the fourth width, a direction from the second position to the first position intersects the third direction, the first light beam has a first peak wavelength, the second light beam has a second peak wavelength different from the first peak wavelength of the first light beam, and the first optical element has an optical power in the second direction greater than an optical power of the first optical element in the third direction, and the second light beam is adjacent to the first light beam along the second direction among light beams emitted from light source, wherein the light source is configured to emit a plurality of the first light beams, and wherein a direction from an incident position of one of the plurality of first light beams on the first surface to an incident position of another one of the plurality of first light beams on the first surface lies along the third direction, wherein the first surface comprises a plurality of second optical regions, wherein one of the plurality of first light beams is incident on a corresponding one of the plurality of second optical regions, wherein another one of the plurality of first light beams is incident on a corresponding another one of the plurality of second optical regions, wherein the one of the plurality of second optical regions comprises a lens and/or a prism, and wherein the another one of the plurality of second optical regions comprises a lens and/or a prism.

13. The light source module according to claim 12, wherein a direction from the other one of the plurality of second optical regions to the one of the plurality of second optical regions lies along the third direction.

14. A light source module comprising:

a light source configured to emit a first light beam and a second light beam; and a first optical element having a first surface on which the first light beam and the second light beam are to be incident, wherein the first light beam and the second light beam are incident on the first surface along a first direction such that the first light beam is incident at a first position on the first surface and the second light beam is incident at a second position on the first surface, the first light beam has a first width in a second direction intersecting the first direction on the first surface, and a second width in a third direction intersecting a plane including the first direction and the second direction on the first surface, the first width is greater than the second width, the second light beam has a third width in the second direction on the first surface, and a fourth width in the third direction on the first surface, the third width is greater than the fourth width, a direction from the second position to the first position intersects the third direction, the first light beam has a first peak wavelength, the second light beam has a second peak wavelength different from the first peak wavelength of the first light beam, and the first optical element has an optical power in the second direction greater than an optical power of the first optical element in the third direction, the light source module further comprising:

a first mirror on which the first light beam emitted from the first optical element is incident; and a second mirror on which the second light beam emitted from the first optical element is incident, wherein an incidence angle of the first light beam incident on the first mirror differs from an incidence angle of the second light beam incident on the second mirror.

15. The light source module according to claim 14, the light source module further comprising a fly's-eye lens on which the first light beam reflected by the first mirror and the second light beam reflected by the second mirror are incident.

16. The light source module according to claim 15, the light source module further comprising a second optical element in an optical path between the first mirror and the fly's-eye lens, wherein the first light beam is incident on the second optical element along a fourth direction, wherein an optical property of the second optical element in a fifth direction intersecting the fourth direction differs from an optical property of the second optical element in a sixth direction intersecting a plane including the fourth direction and the fifth direction, wherein the fly's-eye lens comprises a plurality of lenses arranged along a seventh direction and an eighth direction, and wherein the seventh direction is inclined with respect to the fifth direction and inclined with respect to the sixth direction.

17. The light source module according to claim 16, wherein an optical power of the second optical element in the fifth direction differs from an optical power of the second optical element in the sixth direction.

18. The light source module according to claim 16, wherein the second optical element is configured to periodically move along a direction intersecting the fourth direction at a frequency of equal to or less than a response time of human vision.

19. A light source module comprising:

a light source configured to emit a first light beam and a second light beam; and a first optical element having a first surface on which the first light beam and the second light beam are to be incident, wherein the first light beam and the second light beam are incident on the first surface along a first direction such that the first light beam is incident at a first position on the first surface and the second light beam is incident at a second position on the first surface, the first light beam has a first width in a second direction intersecting the first direction on the first surface, and a second width in a third direction intersecting a plane including the first direction and the second direction on the first surface, the first width is greater than the second width, the second light beam has a third width in the second direction on the first surface, and a fourth width in the third direction on the first surface, the third width is greater than the fourth width, a direction from the second position to the first position intersects the third direction, the first light beam has a first peak wavelength, the second light beam has a second peak wavelength different from the first peak wavelength of the first light beam, the first optical element has an optical power in the second direction greater than an optical power of the first optical element in the third direction, wherein the first width is a maximum width of the first light beam on the first surface, and wherein the second width is a minimum width of the first light beam on the first surface.

* * * * *